(12) United States Patent
Cheng et al.

(10) Patent No.: US 7,659,178 B2
(45) Date of Patent: Feb. 9, 2010

(54) SEMICONDUCTOR DEVICE STRUCTURES WITH REDUCED JUNCTION CAPACITANCE AND DRAIN INDUCED BARRIER LOWERING AND METHODS FOR FABRICATING SUCH DEVICE STRUCTURES AND FOR FABRICATING A SEMICONDUCTOR-ON-INSULATOR SUBSTRATE

(75) Inventors: Kangguo Cheng, Beacon, NY (US); Louis Lu-Chen Hsu, Fishkill, NY (US); Jack Allan Mandelman, Flat Rock, NC (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 381 days.

(21) Appl. No.: 11/379,655

(22) Filed: Apr. 21, 2006

(65) Prior Publication Data
US 2007/0246752 A1 Oct. 25, 2007

(51) Int. Cl.
*H01L 21/311* (2006.01)
*H01L 21/3115* (2006.01)

(52) U.S. Cl. .......... 438/409; 438/407; 438/422; 438/411; 438/960; 257/E31.013

(58) Field of Classification Search .......... 438/407, 438/409, 411, 421, 422, 480, 517, 619, 960, 438/311; 257/E31.014, E31.013, E31.018
See application file for complete search history.

(56) References Cited

U.S. PATENT DOCUMENTS

| | | | |
|---|---|---|---|
| 5,374,564 A | 12/1994 | Bruel | |
| 5,882,987 A | 3/1999 | Srikrishnan | |
| 6,004,837 A * | 12/1999 | Gambino et al. | 438/157 |
| 6,210,998 B1 * | 4/2001 | Son | 438/162 |
| 6,479,866 B1 * | 11/2002 | Xiang | 257/347 |
| 6,509,613 B1 * | 1/2003 | En et al. | 257/349 |
| 6,727,157 B2 * | 4/2004 | Seo | 438/421 |

(Continued)

OTHER PUBLICATIONS

U.S. Patent and Trademark Office, Office Action dated as mailed on Apr. 3, 2009 for related U.S. Appl. No. 11/875,013.

(Continued)

*Primary Examiner*—David Vu
*Assistant Examiner*—Earl N Taylor
(74) *Attorney, Agent, or Firm*—Wood, Herron & Evans, LLP

(57) ABSTRACT

Semiconductor device structures with reduced junction capacitance and drain induced barrier lowering, methods for fabricating such device structures, and methods for forming a semiconductor-on-insulator substrate. The semiconductor structure comprises a semiconductor layer and a dielectric layer disposed between the semiconductor layer and the substrate. The dielectric layer includes a first dielectric region with a first dielectric constant and a second dielectric region with a second dielectric constant that is greater than the first dielectric constant. In one embodiment, the dielectric constant of the first dielectric region may be less than about 3.9 and the dielectric constant of the second dielectric region may be greater than about ten (10). The semiconductor-on-insulator substrate comprises a semiconductor layer separated from a bulk layer by an insulator layer of a high-dielectric constant material. The fabrication methods comprise modifying a region of the dielectric layer to have a lower dielectric constant.

20 Claims, 13 Drawing Sheets

U.S. PATENT DOCUMENTS

| | | |
|---|---|---|
| 6,764,898 B1 | 7/2004 | En et al. |
| 6,855,639 B1 | 2/2005 | Brask et al. |
| 7,122,863 B1 * | 10/2006 | Ju et al. ............... 257/349 |
| 2003/0024732 A1 | 2/2003 | Ninomiya |
| 2003/0125925 A1 | 7/2003 | Walther et al. |
| 2003/0194847 A1 * | 10/2003 | Chen et al. ............ 438/407 |
| 2006/0001073 A1 | 1/2006 | Chen et al. |
| 2007/0157140 A1 | 7/2007 | Holesovsky et al. |

OTHER PUBLICATIONS

Timokhov, D.F. et al., Determination of Structure Parameters of Porous Silicon by the Photoelectric Method, Journal of Physical Studies, V. 8, No. 2 (2004), p. 173-177.

* cited by examiner

SEMICONDUCTOR DEVICE STRUCTURES WITH REDUCED JUNCTION CAPACITANCE AND DRAIN INDUCED BARRIER LOWERING AND METHODS FOR FABRICATING SUCH DEVICE STRUCTURES AND FOR FABRICATING A SEMICONDUCTOR-ON-INSULATOR SUBSTRATE

FIELD OF THE INVENTION

The invention relates generally to semiconductor device structures and methods for fabricating semiconductor structures and, in particular, to semiconductor device structures with reduced junction capacitance and drain induced barrier lowering and methods of fabricating such metal-oxide-semiconductor device structures. The invention also relates to methods of making semiconductor-on-insulator substrates useful for fabricating semiconductor device structures.

BACKGROUND OF THE INVENTION

Metal-oxide-semiconductor field-effect transistors (MOSFETs) are common semiconductor device structures widely used in the semiconductor industry for switching, amplification, filtering, and other applications related to both analog and digital electrical signals. Conventional planar MOSFETs include a gate electrode overlying a channel region near an upper surface of a semiconductor substrate and a gate dielectric physically separating the gate electrode from the semiconductor material of the channel region. The channel region and gate electrode are flanked on opposite sides by doped source/drain regions defined in the semiconductor material of the substrate. In operation, biasing the gate electrode creates an electric field in the channel region of the substrate, which inverts a thin portion of the channel to a conductive state underneath the gate dielectric and permits minority carriers to travel through the channel between the source/drain regions.

The semiconductor industry consistently strives to fabricate individual devices with smaller physical dimensions, which is referred to as scaling. Scaling is desirable in order to increase the number of individual devices that can be fabricated using a given area of semiconductor material and to reduce the unit cost and power consumption. Scaling of device feature sizes also improves performance (e.g., increased switching speed) because charge carriers travel shorter distances in the compact device constructions.

Constructing MOSFETs using semiconductor-on-insulator (SOI) technology offers various advantages over counterpart bulk devices including, but not limited to, higher performance, which in part results from lowered parasitic junction capacitance, absence of latch-up, higher packing density, and low voltage applications. Generally, SOI substrates used in these technologies include a thin active layer of silicon, often referred to as an SOI layer, partitioned into discrete electrically-isolated islands or regions (i.e., SOI regions) used to fabricate devices and a thin buried layer of an insulator, also referred to as a back oxide (BOX), electrically isolating the active layer from the balance of the substrate. The source and drain regions of traditional SOI MOSFETs are formed within the active layer of the SOI substrate. The most common material conventionally used for forming the buried insulator layer of an SOI substrate is silicon dioxide having a dielectric constant in the range of 3.9 to 4.2. Generally, the dielectric constant of conventional or standard materials used in the buried insulator layer ranges from 3.9 to 9.

Scaling SOI MOSFETs presents design challenges to the semiconductor industry. Specifically, as the device channel length of an SOI MOSFET is scaled, the SOI layer thickness and the thickness of the buried insulator layer must also be reduced. As the channel length is shortened, the potential barrier between the source/drain regions is reduced due to modulation by the drain electric field. This effect, which is known as drain induced barrier lowering or DIBL, degrades the sub-threshold swing in deep sub-micron devices. Thinning the buried insulator layer reduces DIBL by suppressing the penetration of the drain field towards the source. In the thinned buried insulator layer, DIBL is reduced because a larger fraction of the drain field lines terminate on the substrate instead of the source. However, thinning the buried insulator layer increases junction capacitance, which slows device performance. Conventional approaches for scaling the channel length in SOI MOSFETs into the deep-submicron range have been unable to adequately balance the competing performance drawbacks of DIBL and junction capacitance.

What is needed, therefore, are semiconductor device structures and fabrication methods that overcome these and other disadvantages of conventional SOI MOSFET semiconductor structures and methods of manufacturing such SOI MOSFET semiconductor structures.

SUMMARY OF THE INVENTION

The present invention is directed to semiconductor device structures and fabrication methods for metal-oxide-semiconductor field-effect transistors (MOSFETs) fabricated using a semiconductor-on-insulator (SOI) substrate in which the insulator layer is composed of dielectric materials with different dielectric constants. The composite insulator layer strategically positions the different dielectric materials in relation to the constituent components of the MOSFET to balance junction capacitance and drain induced barrier lowering (DIBL) in the MOSFET.

In accordance with an aspect of the present invention, a semiconductor device structure comprises a substrate, a semiconductor layer comprising a semiconductor material, and a dielectric layer disposed between the semiconductor layer and the substrate. The dielectric layer includes a first dielectric region with a first dielectric constant and a second dielectric region with a second dielectric constant that is greater than the first dielectric constant. In one embodiment, the dielectric constant of the first dielectric region may be less than about 3.9 and the dielectric constant of the second dielectric region may be greater than about ten (10). The semiconductor layer may further include a doped region registered with the first dielectric region. In particular, the doped region may be a source/drain region of a field effect transistor, and the semiconductor device structure may further comprise a gate electrode disposed on the semiconductor layer that is registered with the second dielectric region.

In accordance with another aspect of the present invention, a method is provided for fabricating a semiconductor device structure using a substrate carrying a dielectric layer and a semiconductor layer on the dielectric layer. The method comprises implanting ions through the semiconductor layer into a region of the dielectric layer and then at least partially removing the ion implanted region of the dielectric layer to define a gas-filled void.

In accordance with another aspect of the present invention, a method is provided for fabricating a semiconductor-on-insulator substrate. The method comprises forming a first dielectric layer with a dielectric constant greater than about ten (10) on a first substrate comprising a semiconductor material and forming a second dielectric layer with a dielectric constant greater than about ten (10) on a second substrate. The method further comprises bonding the first and second dielectric layers to mechanically couple the first and second substrates and partially removing the first substrate to leave a semiconductor layer of the semiconductor material on the second substrate that is separated from the second substrate by. A region of the bonded first and second dielectric layers may be modified to reduce the dielectric constant of the modified region.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
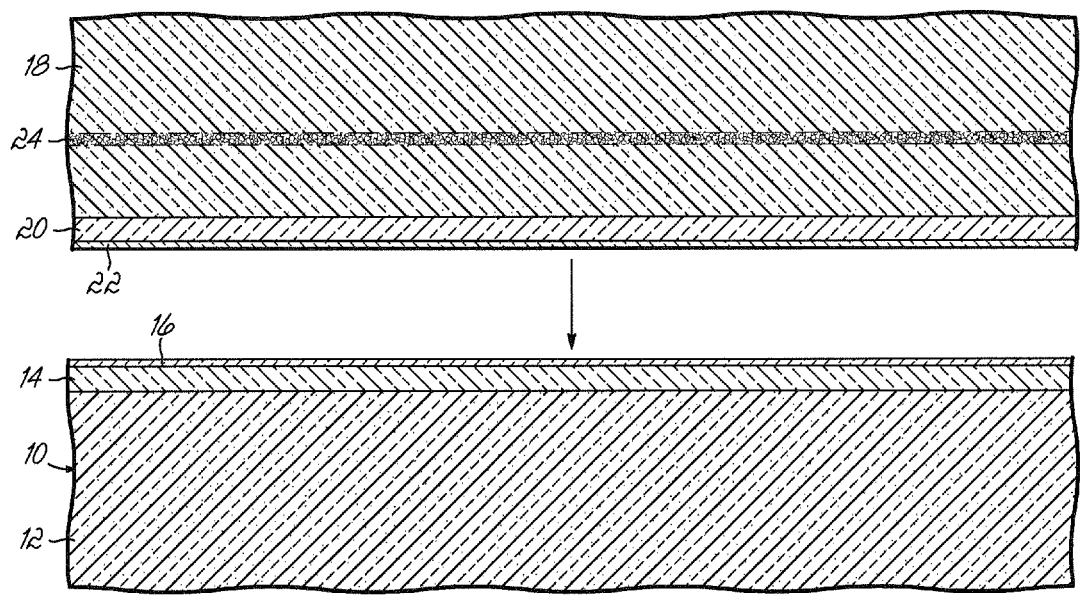
FIGS. 1-10 are diagrammatic cross-sectional views of a portion of a substrate at successive fabrication stages of a processing method in accordance with an embodiment of the present invention.

The present invention is directed to semiconductor device structures and fabrication methods for metal-oxide-semiconductor field-effect transistors (MOSFETs) fabricated using semiconductor-on-insulator (SOI) substrates having a composite insulator layer composed of dielectric materials with different dielectric constants that cooperate, when strategically positioned, to balance junction capacitance and drain induced barrier lowering (DIBL) in the MOSFET. Specifically, the semiconductor device structure includes an electrically thin back insulator beneath the channel region of the SOI MOSFET that operates to suppress DIBL and an electrically thick back insulator under the source/drain regions of the SOI MOSFET that acts to reduce the junction capacitance. The region of the back insulator beneath the channel region is formed from a dielectric material having a significantly higher dielectric constant than the dielectric material forming the region of the back insulator beneath the source/drain regions. The electrically thin back insulator may comprise a high dielectric constant (high-K) dielectric and the electrically thick insulator may comprise a low-K material, such as a sealed void having a dielectric constant approximately equal to unity (1.0). The present invention will now be described in greater detail by referring to the drawings that accompany the present application.

With reference to FIG. 1, a first substrate 10 is provided that includes a thick layer 12 and a relatively thin layer 14 of a dielectric material having a high dielectric constant deposited on layer 12. Substrate 10 may comprise a semiconductor such as silicon, a conductor such as aluminum, copper, tungsten, silicides, conductive nitrides, or combinations of these materials, or an insulator. The thickness of the substrate 10 may range from about fifty (50) μm to about seven hundred (700) μm. A thin layer 16 of a material having a dielectric constant between about four (4) and about nine (9), such as silicon dioxide, silicon nitride, silicon oxynitride, or composites thereof deposited by a CVD process, is formed across the exposed surface of the dielectric layer 14. Layer 16 may have a physical thickness of about one (1) nm to about two (2) nm. The subsequent description assumes that layer 16 is present.

A second substrate 18 comprises a semiconductor material, preferably monocrystalline silicon or silicon germanium, although other semiconductor materials may also be used. A layer 20 of a dielectric material having a high dielectric constant is deposited on substrate 18. A thin layer 22 of a material having a dielectric constant between about four (4) and about nine (9), such as silicon dioxide, silicon nitride, silicon oxynitride, or composites thereof deposited by a CVD process, is formed across the exposed surface of the dielectric layer 20. Layer 22 may have a physical thickness of about one (1) nm to about two (2) nm. If layer 16 is present on the first substrate 10, then layer 22 is optional.

The second substrate 18 is ion implanted, before being contacted and bonded with substrate 10, using a conventional ion implantation process with hydrogen ions, or other rare gas ions, of relatively low energy to create a shallow and narrow damaged region or band 24. The hydrogen implant is preferably done prior to formation of dielectric layers 20 and 22. Alternatively, the hydrogen implant may be conducted after formation of one or both of dielectric layers 20 and 22. The depth of the stressed damaged band 24 may be about fifty (50) nm to about two hundred (200) nm vertically beneath the dielectric layer 20. The stopped hydrogen or other rare gas will have a concentration distributed in a depth profile across the damaged band 24. The damaged band 24, after a suitable thermal treatment, defines a cleaving plane that permits subsequent separation of a thin upper layer generally between band 24 and dielectric layer 20.

The dielectric layers 14, 20 may be composed of any suitable high-K dielectric material with an appropriately high relative permittivity or dielectric constant. Advantageously, the high-K dielectric material constituting dielectric layers 14, 20 may be crystallized at normal process temperatures and is stable at the temperatures required for subsequent fabrication steps. Suitable materials include, but are not limited to, metal oxides such as aluminum oxide ($Al_2O_3$), tantalum oxide ($Ta_2O_5$), hafnium oxide ($HfO_2$), and zirconium oxide ($ZrO_2$), deposited by a CVD process or a physical vapor deposition (PVD) process. The thickness of the dielectric layers 14, 20 may range from about five (5) nm to about one hundred (100) nm. Because of the relatively high dielectric constant of the high-K dielectric material, the physical thickness of each of the dielectric layers 14, 20 may be substantially less than the physical thickness of an electrically-equivalent standard-K dielectric material, such as silicon dioxide and silicon nitride. The dielectric material of dielectric layers 14, 20 are characterized by a dielectric constant that is greater than about ten (10). The use of a high-K dielectric material permits the layers 14, 20 to have a low electrical thickness in a physically thick layer.

The substrates 10, 18 are manipulated into a confronting relationship that places dielectric layers 16, 22 into contact and, thereafter, are bonded together or mechanically coupled by a conventional bonding process that subjects the layers 16, 22 to conditions capable of increasing their mutual bonding energy. Advantageously, the dielectric layers 16, 22 each have a flat, smooth finish that promotes bonding. A typical conventional bonding process involves a relatively low temperature thermal treatment or anneal at a sufficient temperature and for a sufficient duration to prompt bonding. For example, the dielectric layers 16, 22 may be bonded by annealing at a temperature ranging from 450° C. to 550° C. Optionally, the substrates 10, 18 may be clamped together during the thermal anneal by applying mechanical pressure typically between about 2 kg/cm$^2$ and about 2.5 kg/cm$^2$. The thermal anneal, which may be performed in the presence or absence of the mechanical pressure, is also typically performed in a controlled atmosphere consisting predominately of an inert gas, such as $N_2$. If the optional one of layer 16 and layer 22 is omitted, dielectric layer 22 is bonded directly to dielectric layer 14 to mechanically couple the substrates 10, 18.

Figure 2:
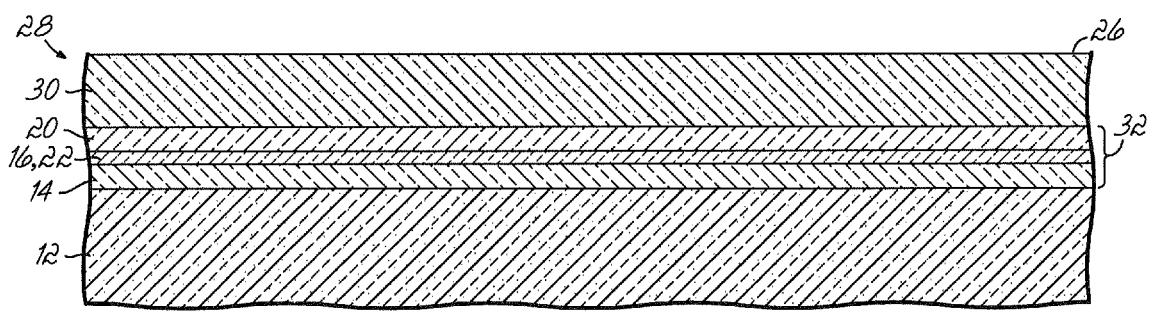

With reference to FIG. 2 in which like reference numerals refer to like features in FIG. 1 and at a subsequent fabrication stage, the bonded substrates 10, 18 are then thermally treated in an inert atmosphere and at a temperature that may be greater than the temperature of the preceding thermal treatment that causes bonding. Advantageously, the temperature and duration of the thermal anneal are sufficient to cause the hydrogen, or other rare gas, in the damaged band 24 (FIG. 1) to coalesce into microscopic bubbles. Suitable coalescence temperatures may be in the range of about 500° C. to about 700° C. The hydrogen or inert gas bubbles formed in the damaged band 24 may spontaneously cause separation along a cleaving plane defined generally by the damaged band 24. Separation along the damaged band 24 may be mechanically assisted by, for example, the use of a water jet to initiate a fracture that propagates across the damaged band 24.

The constituent semiconductor material of substrate 18 between the damaged band 24 and the dielectric layer 22 remains bonded to substrate 10. A top surface 26 results after separation along the cleaving plane. The top surface 26 is planarized and polished by, for example, a conventional chemical-mechanical polishing (CMP) process to be approximately flat and smooth to provide a substrate 28. Exemplary processes for forming substrate 28 include the Smart Cut™ process and the processes described in U.S. Pat. Nos. 5,374,564 and 5,882,987, the disclosure of each of which is hereby incorporated by reference herein in its entirety.

The resultant substrate 28 includes an active device or SOI layer 30 comprising semiconductor material originating from substrate 18 and a buried insulator layer 32. The buried insulator layer 32 is a composite or laminate comprising the high-K dielectric layers 14, 20, oxide layer 22, and the optional oxide layer 16. The dielectric constant of the composite is a thickness-weighted average of the dielectric constants of the individual layers 14, 16, 20 and optionally layer 22. The average dielectric constant of the composite material of the buried insulator layer 32 is greater than about ten (10). The SOI layer 30 and buried insulator layer 32 are carried and supported on substrate 10, which supplies mechanical robustness and facilitates handling, and may also define an electrically conductive ground plane.

Figure 3:
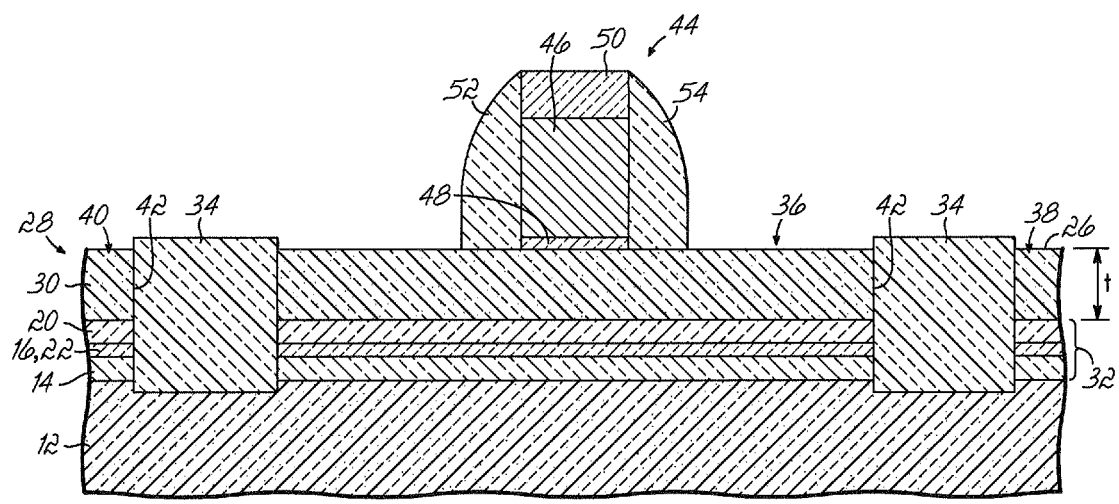

With reference to FIG. 3 in which like reference numerals refer to like features in FIG. 2 and at a subsequent fabrication stage, a plurality of dielectric-filled shallow trench isolation regions 34 are defined in the substrate 28 and extend completely through the SOI layer 30 to define a body 36 of semiconductor material. The shallow trench isolation regions 34 also extend completely through the buried insulator layer 32. The shallow trench isolation regions 34 electrically isolate the body 36 of semiconductor material from adjacent bodies 38, 40 similar to body 36.

Trenches 42 are formed by patterning pad and hardmask layers (not shown) applied to the top surface 26 using conventional lithography and an etching process and then filling the trenches 42 with an insulating or dielectric material such as CVD oxide, tetraethylorthosilicate (TEOS), or a high-density plasma (HDP) oxide deposited by any of a number of techniques, such as PECVD, familiar to a person having ordinary skill in the art. Any overfill of dielectric material may be removed by planarizing with, for example, a conventional CMP process.

After the pad and hardmask layers (not shown) are stripped, a semiconductor device 44 is partially fabricated using the body 36 of semiconductor material. Other semiconductor devices (not shown) are partially fabricated in other bodies of semiconductor material, such as the adjacent bodies 38, 40, distributed across the substrate 28. Semiconductor device 44 may have any suitable construction as recognized by a person having ordinary skill in the art.

In one embodiment of the present invention, the semiconductor device 44 may be a planar metal oxide semiconductor field-effect transistor (MOSFET) that includes a gate electrode 46 and a gate dielectric 48 electrically isolating the gate electrode 46 from the semiconductor material of the body 36. The gate electrode 46 and gate dielectric 48 are formed by conventional methods understood by a person having ordinary skill in the art. The conductor constituting the gate electrode 46 may be, for example, polycrystalline silicon (polysilicon), silicide, metal, or any other appropriate material deposited by a CVD process, etc. The gate dielectric 48 may comprise any suitable dielectric or insulating material including, but not limited to, silicon dioxide, silicon oxynitride, a high-k dielectric, or combinations of these dielectrics. The dielectric material constituting gate dielectric 48 may be between about one (1) nm and about ten (10) nm thick, and may be formed by thermal reaction of the semiconductor material of the SOI layer 30 with a reactant, a CVD process, a physical vapor deposition (PVD) technique, or a combination of these methods.

A protective gate cap 50 of, for example, nitride is applied to a top surface of the gate electrode 46. Gate cap 50 protects the gate electrode 46 and gate dielectric 48 during subsequent processing steps. Sidewall spacers 52, 54 are formed that flank the gate electrode 46 of the semiconductor device 44 and cover the previously bare sidewalls of the gate electrode 46. The sidewall spacers 52, 54 originate from a layer (not shown) of a dielectric material, such as five (5) nm to fifty (50) nm of nitride deposited by CVD, that is shaped by a directional anisotropic etching process that preferentially removes the layer from horizontal surfaces.

Figure 4:
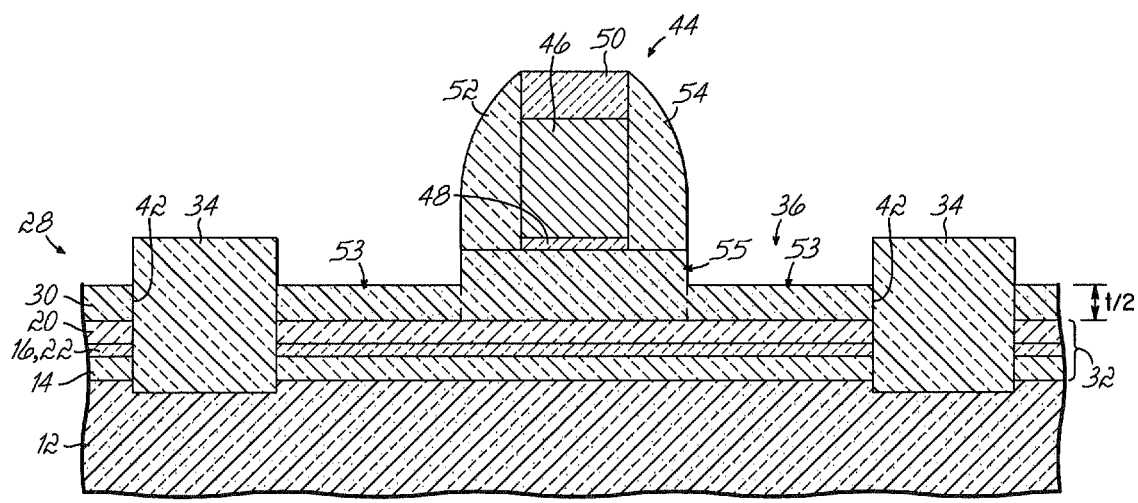

With reference to FIG. 4 in which like reference numerals refer to like features in FIG. 3 and at a subsequent fabrication stage, the top surface 26 of the SOI layer 30 in unmasked regions 53 of the body 36 is recessed by, for example, a reactive ion etch process that removes the semiconductor material selective to the materials constituting the gate cap 50 and sidewall spacers 52, 54. For example, the reactive ion etch may be a silicon etch selective to silicon nitride and silicon dioxide. A region 55 of body 36 is masked from the process by the gate electrode 46, gate cap 50 and sidewall spacers 52, 54. The semiconductor material of the body 36 is thinned in the unmasked regions 53 to a thickness (t/2) that may be approximately half of the original thickness (t) of the SOI layer 30. Due to the directionality of the etching process, a masked region 55 retains the original material thickness in which the top surface 26 remains at the same vertical distance form the buried insulator layer 32.

Figure 5:
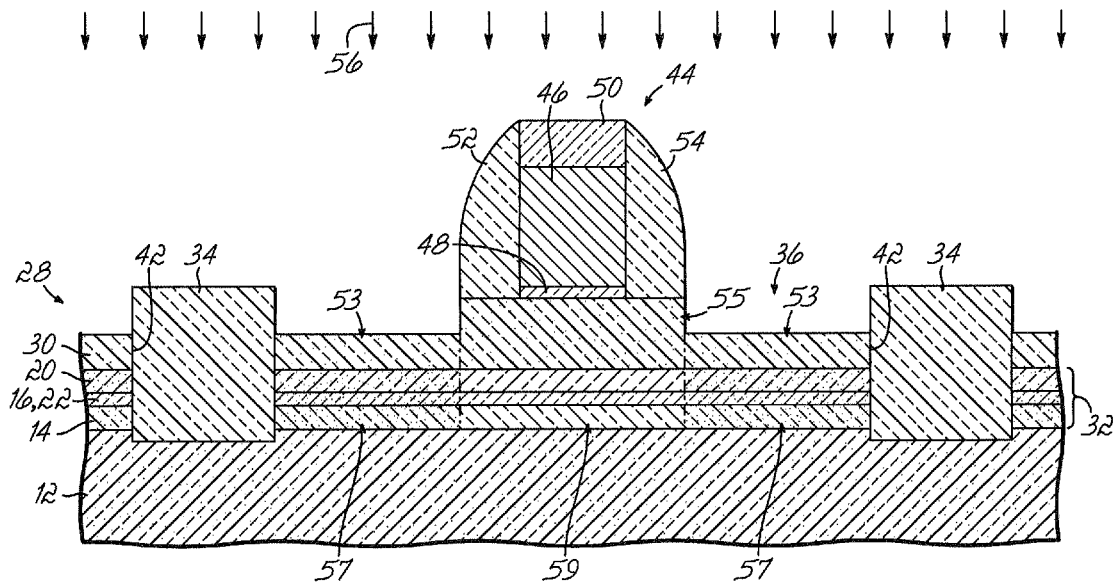

With reference to FIG. 5 in which like reference numerals refer to like features in FIG. 4 and at a subsequent fabrication stage, unmasked regions 57 of the buried insulator layer 32 are damaged by implanting ions 56 into the top surface 26. The masked region 55 of the body 36 and an underlying masked region 59 of the buried insulator layer 32 are protected from receiving a meaningful dose of the implanted ions 56 by the gate electrode 46, gate cap 50 and sidewall spacers 52, 54. The gate cap 50 and sidewall spacers 52, 54 shield or protect the gate electrode 46 against receiving an ion dose during the implantation.

Energetic ions, as indicated diagrammatically by singled-headed arrows 56, are directed by an ion implantation process into the unmasked regions 57 of the buried insulator layer 32. Specifically, a beam of energetic ions 56 is generated from a source gas and directed to impinge the recessed top surface 26. The implanted ions 56 penetrate through the unmasked regions 53 to reach the unmasked regions 57 of the buried insulator layer 32. Preferably, the ions 56 are implanted with the substrate 28 held at room or ambient temperature and with a near-normal incidence angle to the top surface 26, although the present invention is not so limited. Suitable ions 56 include, but are not limited to, xenon (Xe) and germanium (Ge) implanted at a dose of $10^{14}$ cm$^{-2}$ to $10^{16}$ cm$^{-2}$. Other suitable ions 56 may include helium, neon, argon, silicon, nitrogen, oxygen, and halogens such as chlorine, fluorine, bromine, or iodine.

The ions 56 lose kinetic energy via nuclear and electronic scattering events with the materials constituting the body 36 and the buried insulator layer 32 as the ions 56 penetrate the substrate 28. The ions 56 eventually dissipate all of their initial kinetic energy and stop in the substrate 28, predominately in the buried insulator layer 32. The depth profile of the stopped ions 56 is distributed about a projected range, which is measured as a perpendicular distance of a concentration peak from the recessed top surface 26. The depth profile is also characterized by a range straggle, which represents a deviation or second moment of the stopped ions 56 about the projected range. Substantially all of the implanted ions 56 come to rest in the substrate 28 within a distance of three times the range straggle from the projected range.

The ion kinetic energy, or energies of multiple implants, for the ions 56 is selected such that the vast majority of the implanted ions 56 come to rest within the buried insulator layer 32, which maximizes the ion-induced damage in the buried insulator layer 32. Energy transferred by nuclear collisions from ions 56 to target atoms in layers 14, 20 displaces target atoms from their original lattice sites and, as a consequence, permanently damages the constituent high-K dielectric material of layers 14, 20. When each individual ion 56 displaces a target atom in the buried insulator layer 32 in a nuclear scattering event, a recoil cascade is initiated that dissipates the transferred kinetic energy by collisions with other target atoms that generates additional vacancies and interstitial atoms in the lattice structure of the high-K dielectric material constituting layers 14, 20. The crystalline damage profile coincides approximately with the depth profile of the stopped ions 56.

After a sufficient ion dose is implanted, the energy loss and stopping of the ions 56 destroys the crystal structure of the high-K dielectric material across at least a portion of the thickness of the layers 14, 20 in the unmasked regions 57 of the buried insulator layer 32 to form non-monocrystalline material. The damage in the buried insulator layer 32 may amorphize the crystalline structure of layers 14, 20.

Figure 6:
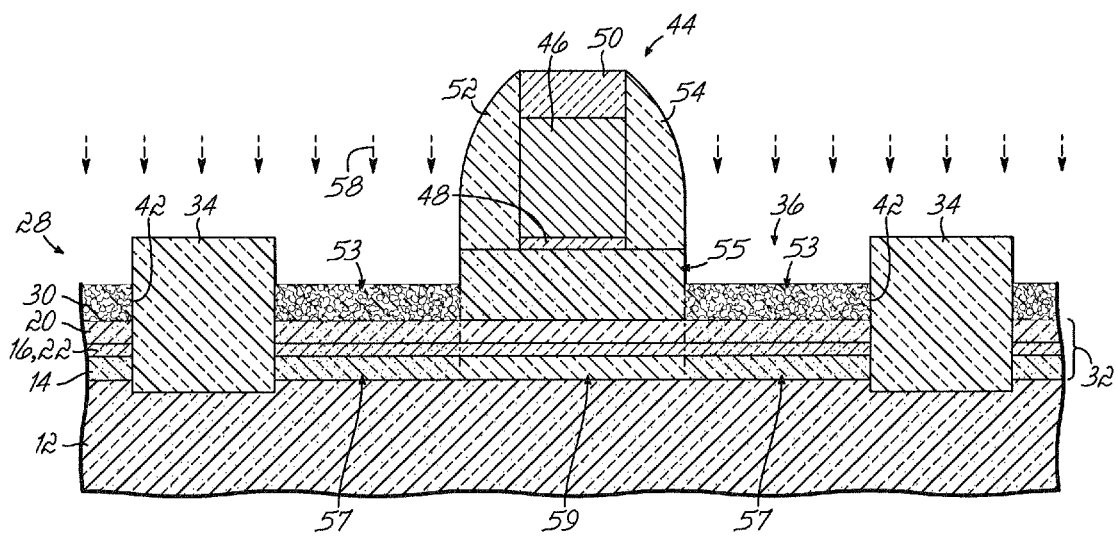

With reference to FIG. 6 in which like reference numerals refer to like features in FIG. 5 and at a subsequent fabrication stage, the semiconductor material in the unmasked regions 53 of the body 36 is converted to porous semiconductor material. The masked region 55 is protected from the conversion process by the gate electrode 46, gate cap 50 and sidewall spacers 52, 54 so that the constituent semiconductor material is unaffected. The gate cap 50 and sidewall spacers 52, 54 protect the gate electrode 46 during the conversion process. Adjacent bodies 38, 40, as well as other bodies distributed across the SOI layer 30 of substrate 28, are also subjected to this fabrication step.

In one exemplary embodiment of the present invention, the semiconductor material in the unmasked regions 53 of body 36 may be converted to porous silicon by a conversion process that includes doping followed by anodization. To that end, a high concentration of a p-type dopant 58 is introduced into the unmasked regions 53 of semiconductor material by, for example, gas phase doping, solid source doping, ion implantation, or a combination of these techniques. The p-type dopant 58 may be selected from boron (B), gallium (Ga), aluminum (Al), or a combination of these dopants, and may be introduced into the semiconductor material at an atomic concentration ranging from about $5 \times 10^{17}$ cm$^{-3}$ to about $1 \times 10^{21}$ cm$^{-3}$ and with a suitable kinetic energy to span the thickness of the unmasked regions 53. The substrate 28 may be annealed after introduction of the p-type dopant 58 at a temperature ranging from about 750° C. to about 1100° C. for five (5) seconds to thirty (30) minutes to uniformly distribute the p-type dopant 58 in the semiconductor material of the unmasked regions 53 and to activate the p-type dopant 58.

The heavily doped silicon in the unmasked regions 53 of body 36 is then subjected to an anodization process in an aqueous electrolyte or anodization solution that typically contains hydrofluoric acid (HF), such as a mixture of HF and a monohydric alcohol such as methanol, ethanol, or n- or iso-propanol. The monohydric alcohol is added to the solution to improve the wettability of the hydrofluoric acid. The substrate 28 is contacted with a positively-biased electrode and immersed along with a separate negatively-biased electrode into a bath of the anodization solution. An electrical current is flowed through the electrodes and the SOI layer 30 of the substrate 28 for an anodization time sufficient to convert the heavily doped silicon to porous silicon. A light source may be optionally used to illuminate the SOI layer 30 during the anodization process. The anodization process may be performed at room temperature or at a temperature exceeding room temperature. Following the anodization process, the substrate 28 may be rinsed with deionized water and dried.

The anodization process creates pores across the thickness of the unmasked regions 53 of the body 36. The interconnectivity of the pores extends from the surface 26 to the interface between the body 36 and the buried insulator layer 32. The resulting size and density of the porosity is proportional to material properties like the p-type dopant concentration, and to other non-material properties such as the anodization current and voltage, the acid concentration in the anodization solution, illumination, and the temperature of the anodization solution. For example, the anodization process converting the silicon in the unmasked regions 53 of the body 36 to porous silicon may be conducted in an aqueous 1:1 HF (49%) and ethanol solution at a current density ranging from about 1 mA/cm$^2$ to about 40 mA/cm$^2$ in the dark and at room temperature with a process time ranging from several minutes to one hour. The semiconductor material in the masked region 55 of body 36 remains substantially intact and in its initial state.

Figure 7:
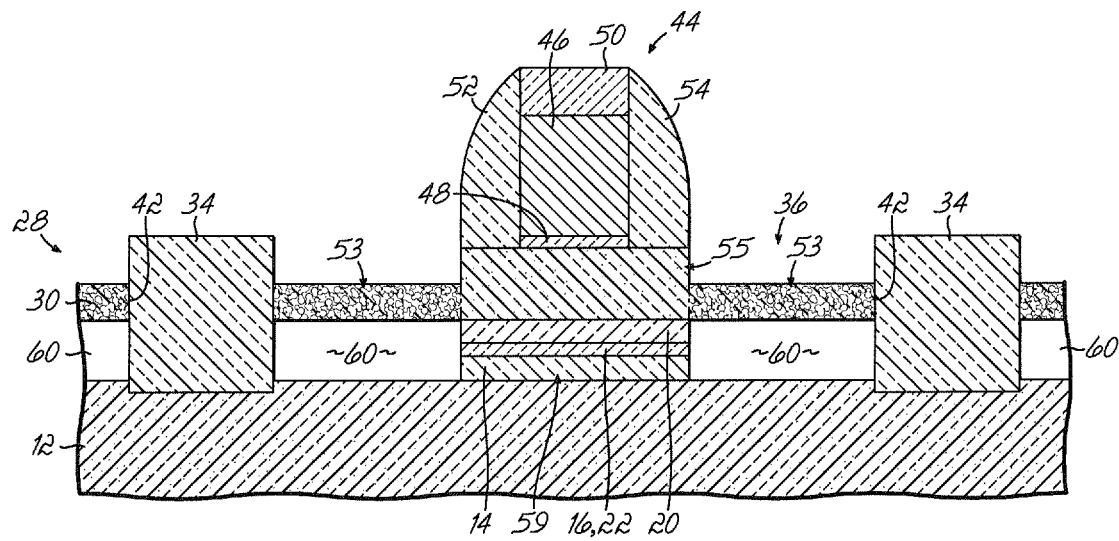

With reference to FIG. 7 in which like reference numerals refer to like features in FIG. 6 and at a subsequent fabrication stage, a wet chemical etch process is used to at least partially remove the damaged, or otherwise implantation-modified, high-K dielectric material in the unmasked regions 57 of the buried insulator layer 32 selectively to the crystalline high-K dielectric material in a masked region 59 of the buried insulator layer 32. The etch rate of the crystalline high-K dielectric material in the masked region 59 is significantly lower than the etch rate of the damaged high-K dielectric material in the unmasked regions 57. The wet chemical etch process is also selective to the constituent materials of the masked region 59, the SOI layer 30, the gate cap 50, and sidewall spacers 52, 54. The gate cap 50 and sidewall spacers 52, 54 protect the gate electrode 46 during the etch process.

The wet etchant used in the process readily penetrates through the interconnected pores in the porous semiconductor material constituting unmasked regions 53 of the body 36 to the underlying damaged or implantation-modified high-K dielectric material in the unmasked regions 57 of the buried insulator layer 32. Suitable wet etchants include, but are not limited to, aqueous solutions of hydrofluoric acid (HF) and/or sulfuric acid ($H_2SO_4$). If ions 56 (FIG. 5) originate from a halogen source, formation of halogen compounds in the constituent high-K dielectric material of the buried insulator layer 32 may advantageously enhance etch selectivity. In addition to the damaged layers 14, 20, layers 16, 22 are also removed by the wet chemical etch process. Although not wishing to be bounded by theory, the damage, or other effect of the implantation, imparted to the high-K dielectric material in the unmasked regions 57 of the buried insulator layer 32 is believed to make the high-K dielectric material susceptible to removal by etching.

The result of this fabrication stage is the formation of at least one void 60 in each of the unmasked regions 57 of the buried insulator layer 32 formerly occupied by the damaged high-K dielectric material of layers 14, 20 and layers 16, 22. The voids 60 are filled by air or another gas, which has a dielectric constant approximately equal to unity (1.0). The voids 60 flank and otherwise bound, or are juxtaposed with, the remaining undamaged high-K dielectric material in the masked region 59 of the buried insulator layer 32, which underlies the masked region 55 of body 36.

The damaged high-K dielectric material of layers 14, 20 and layers 16, 22 between the undamaged high-K dielectric material in layers 14, 20 may be completely removed from the unmasked regions 57, in which case the effective dielectric constant of the buried insulator layer 32 in unmasked regions 57 is approximately unity (1.0). Alternatively, the invention contemplates that layers 14, 20 and/or layers 16, 22 may only be partially removed from the unmasked regions 57 of the buried insulator layer 32 such that the effective dielectric constant in unmasked regions 57 is a volume-averaged composite of the individual dielectric constants of the voids 60 and residual damaged high-K dielectric material and residual dielectric material from layers 16, 22. Advantageously, the effective dielectric constant of the buried insulator layer 32 in the unmasked regions 57 may be less than about 3.9, which represents a dielectric constant characteristic of silicon dioxide. The dielectric constant of the buried insulator layer 32 in region 59 is substantially unaffected by the process steps forming voids 60 and, hence, remains greater than about ten (10). Multiple voids 60 may be formed in each unmasked region 57 that are interconnected or isolated by intervening portions of residual dielectric material.

Figure 8:
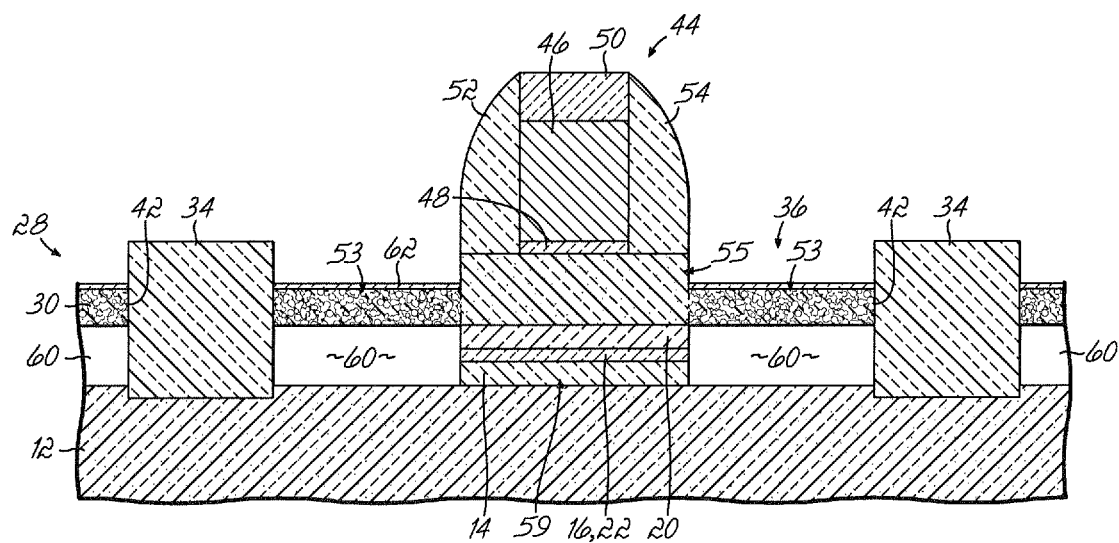

With reference to FIG. 8 in which like reference numerals refer to like features in FIG. 7 and at a subsequent fabrication stage, the semiconductor material of body 36 is treated to form a surface layer 62 that smoothes the top surface 26 and seals pores at the top surface 26 that would otherwise open to, or communicate with, the ambient environment of substrate 28. One treatment process suitable for forming surface layer 62 is a hydrogen anneal in a hydrogen-rich atmosphere, such as $H_2$ or $NH_4$, at a temperature between 850° C. and 1100° C., and for a time ranging from about ten (10) seconds to about thirty (30) minutes. The surface layer 62, which is substantially monocrystalline semiconductor material, provides a crystalline template for epitaxial growth of semiconductor material in a subsequent fabrication step. The hydrogen anneal also reduces the p-type dopant concentration in the porous semiconductor material constituting the unmasked regions 53 which facilitates subsequent source-drain and halo doping used to complete the fabrication of the semiconductor device 44.

Figure 9:
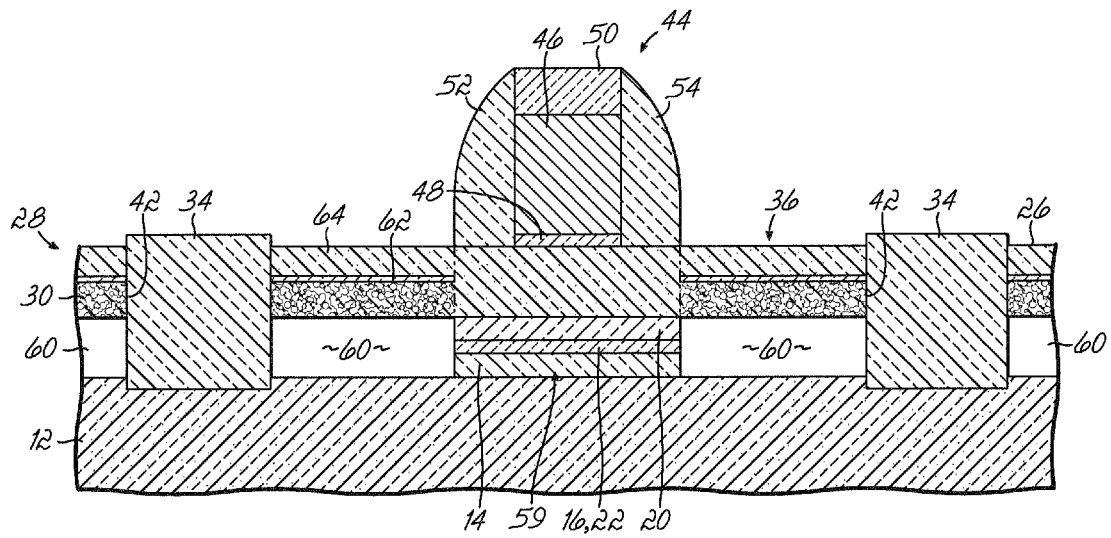

With reference to FIG. 9 in which like reference numerals refer to like features in FIG. 8 and at a subsequent fabrication stage, an epitaxial layer 64 is selectively formed on the unmasked regions 53 using the surface layer 62 as a seed or crystal-orientation template for crystal growth. The epitaxial layer 64 may advantageously comprise the same semiconductor material originally constituting the SOI layer 30. The growth conditions may be selected such that semiconductor material of the epitaxial layer 64 advantageously does not form with an appreciable thickness on vertical surfaces or dielectric surfaces, such as the top surface of the shallow trench isolation regions 34. The epitaxial layer 64 may restore the initial thickness of the semiconductor material of the body 36, as depicted in FIG. 3, or may provide a different thickness in comparison with the masked region 55. In any event, the body 36 is thickened such that the top surface 26 is moved vertically away from the voids 60 and the masked region 59 of the buried insulator region 32. The body 36 seals the voids 60 from the ambient environment above top surface 26.

The epitaxial layer 64 may be formed by a selective epitaxial growth (SEG) process, which is performed at sub-atmospheric process pressures and with a substrate temperature between about 850° C. and about 1050° C. Typical process conditions include a sub-atmospheric pressure of about 40 torr and a substrate temperature of about 900° C. Preferred silicon sources for the SEG process include, but are not limited to, silicon tetrachloride ($SiCl_4$), trichlorosilane ($SiHCl_3$), and dichlorosilane ($SiH_2Cl_2$). Advantageously, the epitaxial layer 64 may be formed to a thickness covering the gate cap 50, polished to the gate cap 50, and then recessed with a suitable anisotropic etching process to the desired thickness. The recessed depth may be selected to introduce a thickness for the SOI layer 30 that permits a raised source-drain (RSD) geometry for reducing series resistance.

Figure 10:
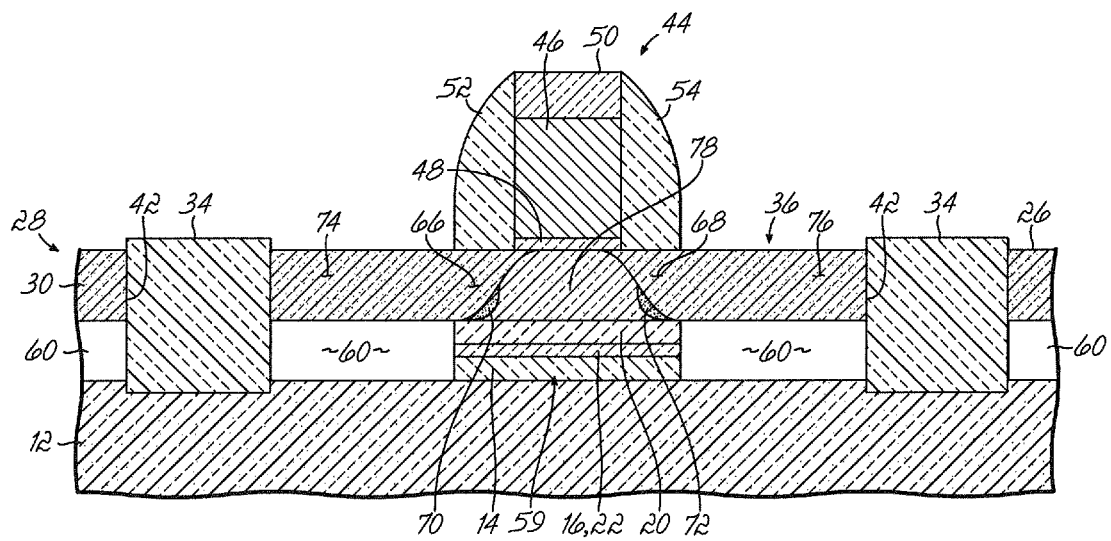

With reference to FIG. 10 in which like reference numerals refer to like features in FIG. 9 and at a subsequent fabrication stage, standard processes are then performed to complete the fabrication of the semiconductor device 44 and the fabrication of an integrated circuit (not shown) including the completed semiconductor device 44. For simplicity of description, the porous semiconductor material of the SOI layer 30, the surface layer 62, and the epitaxial layer 64 are depicted in FIG. 10 as merged to establish the body 36 of semiconductor material in which portions of the semiconductor device 44 are fabricated.

To that end and after removing sidewall spacers 52, 54, a dopant is implanted into the semiconductor material of the body 36 to define shallow source/drain extensions 66, 68 at opposing sides of the gate electrode 46. The extension implant is typically angled to penetrate laterally beneath the gate dielectric 48. The semiconductor material of the body 36 is also ion implanted with a dopant to form halo regions 70, 72 that are located underneath and laterally adjacent to the extensions 66, 68. The halo and extension implants may be performed contemporaneously. After the sidewall spacers 52, 54 are restored on the sidewalls of the gate electrode 46, the semiconductor material of the body 36 is ion implanted with a dose of a dopant to define source/drain regions 74, 76. The ion implant and anneal conditions used in forming the source/drain extensions 66, 68, the halo regions 70, 72, and the source/drain regions 74, 76 are well known to a person having ordinary skill in the art. Additional conventional processing, which includes formation of contact vias and studs (not shown), multilayer patterned metallization (not shown), and interlevel dielectrics (not shown), completes the integrated circuit.

The extensions 66, 68 and source/drain regions 74, 76, which have the same doping polarity (either N-type or P-type), flank a channel region 78 of the semiconductor material of body 36, which is undoped, that underlies the gate electrode 46 and are at opposing sides of the gate electrode 46. The halo regions 70, 72 are of the opposite doping polarity from the extensions 66, 68 and source/drain regions 74, 76. The halo regions 70, 72 and extensions 66, 68 cooperate for controlling source to drain leakage currents between the source/drain regions 74, 76 when the semiconductor device 44 is quiescent or idle (i.e., switched to an "off" state). The channel region 78 may also be doped with the same doping polarity as the halo regions 70, 72 for further reducing leakage currents.

The unmasked regions 57 of the buried dielectric layer 32, which comprise the gas-filled voids 60, border (i.e., are juxtaposed with) the masked region 59 of the buried insulator layer 32. The dielectric constant in the unmasked regions 57 of the buried dielectric layer 32, after the gas-filled voids 60 are formed, is significantly lower than the dielectric constant of the masked region 59 of the buried insulator layer 32. The doped semiconductor material in each of the source/drain regions 74, 76 is registered vertically with one of the unmasked regions 57 of the buried dielectric layer 32. As a result, the source/drain regions 74, 76 each overlie one of the unmasked regions 57, which may advantageously have a dielectric constant less than about 3.9 and, even more advantageously, a dielectric constant of about unity (1.0). The gate electrode 46 is registered vertically with the masked region 59 of the buried dielectric layer 32. As a result, the gate electrode 46 overlies the masked region 59, which advantageously may have a dielectric constant greater than about ten (10). The buried dielectric layer 32 in the unmasked regions 57 and masked region 59 has approximately the same physical thickness. However, the buried dielectric layer 32 in the unmasked regions 57 has a greater electrical thickness than the buried dielectric layer 32 in the masked region 59.

The structure of semiconductor device 44 has a balanced junction capacitance and DIBL such that the channel length may be aggressively scaled for reducing the channel length by reducing the thickness of the body 36. The air- or gas-filled voids 60 beneath the source/drain regions 74, 76 reduce the dielectric constant in the unmasked regions 57 of the buried insulator layer 32 and thereby supply an electrically thick back insulator that acts to reduce the junction capacitance. The high-K dielectric material in the masked region 59 of the buried insulator layer 32 supplies an electrically thin back insulator beneath the channel region 78, which operates to suppress DIBL.

In an alternative embodiment of the present invention, a replacement gate process is used that relies on a "dummy" gate of a sacrificial material for forming the composite buried insulator layer 32. In this instance, fabrication proceeds to provide a structure for the semiconductor device 44 substantially identical to the construction shown in FIG. 10 advantageously absent the actual physical presence of the gate electrode 46 during the fabrication stages forming the voids 60.

Figure 11:
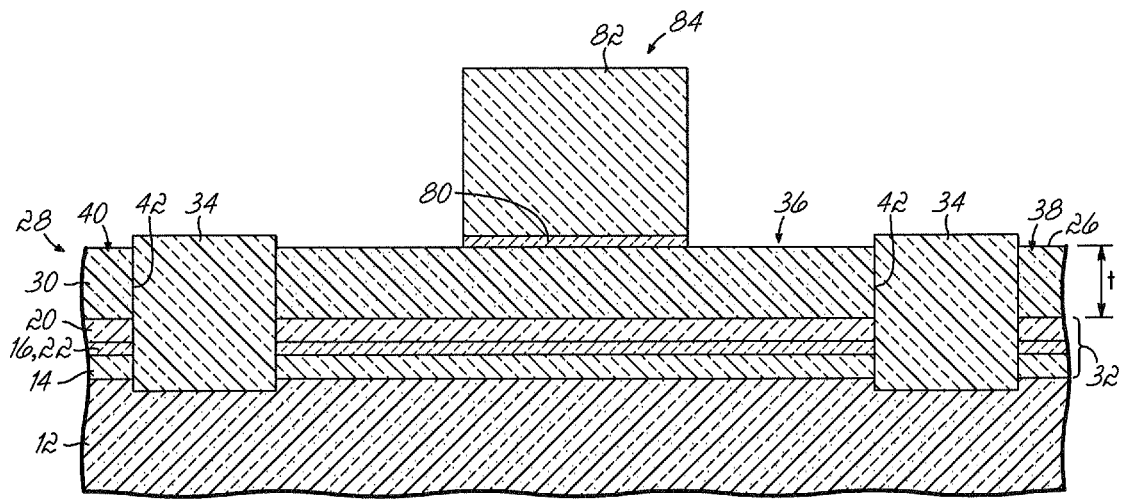
FIGS. 11-21 are diagrammatic cross-sectional views of a portion of a substrate at successive fabrication stages subsequent to the fabrication stage of FIG. 2 of a processing method in accordance with another embodiment of the present invention.

With reference to FIG. 11 in which like reference numerals refer to like features in FIG. 2 and at a subsequent fabrication stage, shallow trench isolation regions 34 are defined in the substrate 28 for electrically isolating the semiconductor material body 36 from adjacent semiconductor material bodies 38, 40, as described with regard to FIG. 3. A thin pad layer 80 and a thick pad layer 82 are formed on the SOI layer 30 and patterned by a conventional lithography and subtractive etching process to define a sacrificial region or dummy gate 84 covering a portion of the top surface 26 of the semiconductor material body 36. The thin pad layer 80 separates the thick pad layer 82 from the top surface 26 of the body 36. Additional dummy gates (not shown), which are similar to dummy gate 84, are formed on other bodies of the semiconductor material of SOI layer 30 including, but not limited to, bodies 38, 40.

The constituent material(s) of pad layers 80, 82 advantageously etch selectively to the semiconductor material constituting body 36. Pad layer 80 may be one (1) nm to ten (10) nm of silicon oxide ($SiO_2$) grown by exposing the body 36 to either a dry oxygen ambient or steam in a heated environment or deposited by a thermal CVD process. Pad layer 82 may be fifty (50) nm to two hundred (200) nm of nitride ($Si_3N_4$) formed by a thermal CVD process like low pressure chemical vapor deposition (LPCVD) or a plasma-assisted CVD process. Pad layer 80 may operate as a buffer layer to prevent any stresses in the material constituting the thicker pad layer 82 from causing dislocations in the semiconductor material of the body 36.

Figure 12:
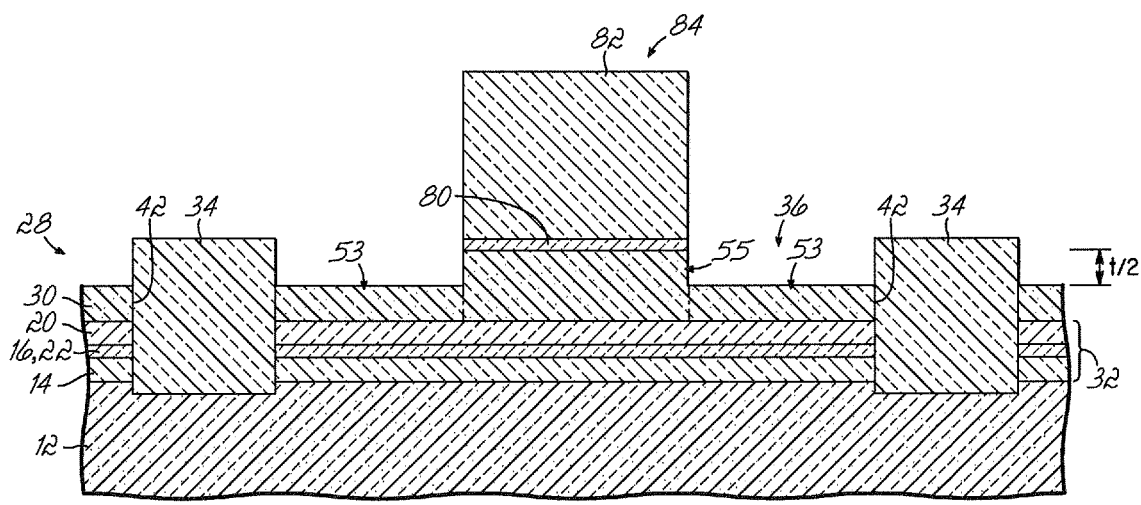

With reference to FIG. 12 in which like reference numerals refer to like features in FIG. 11 and at a subsequent fabrication stage, the top surface 26 of the body 36 is recessed in the unmasked regions 53 relative to the masked region 55, as described with regard to FIG. 4. In this embodiment of the present invention, the masked region 55 is masked by the dummy gate 84 from the effects of a reactive ion etch that removes the semiconductor material of the body 36 preferentially or selectively to the materials constituting the dummy gate 84. For example, the reactive ion etch may be a silicon etch selective to silicon nitride and silicon dioxide. The thickness of the semiconductor material in the unmasked regions 53 is approximately one-half of the original thickness (t) of the SOI layer 30. The masked region 55 of the body 36, which is unrecessed and self-aligned with the protective dummy gate 84, retains the original thickness of the SOI layer 30.

Figure 13:
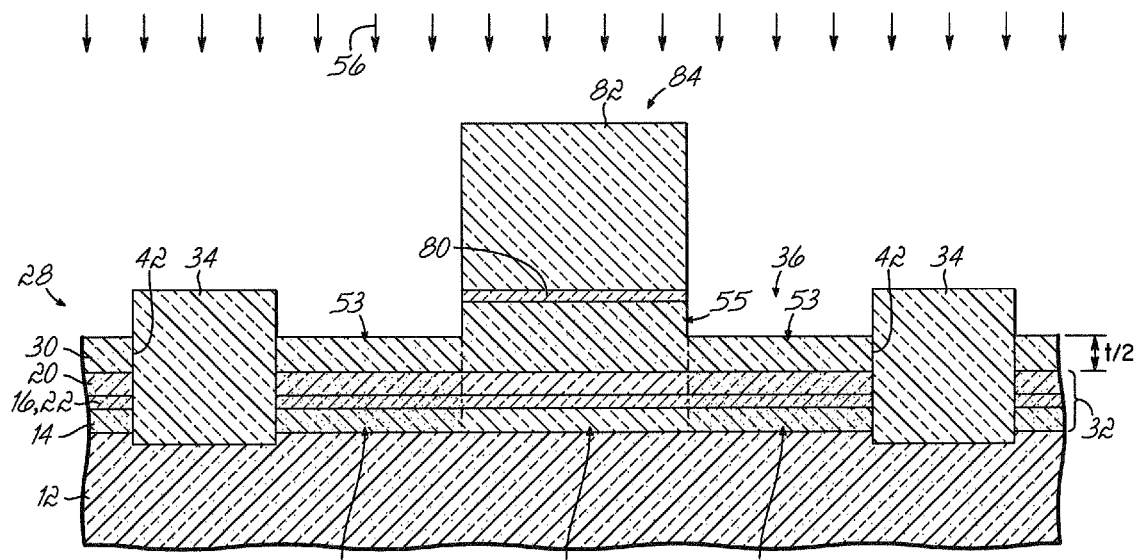

With reference to FIG. 13 in which like reference numerals refer to like features in FIG. 12 and at a subsequent fabrication stage, regions of the buried insulator layer 32 that are not masked by the dummy gate 84 are damaged by implanting ions 56, as described with regard to FIG. 5. The masked region 55 of the body 36 is protected from the implanted ions 56 by the dummy gate 84, which has a thickness and stopping power sufficient to ensure that the trajectories of the ions 56 cannot reach the body 36 in the masked region 55.

Figure 14:
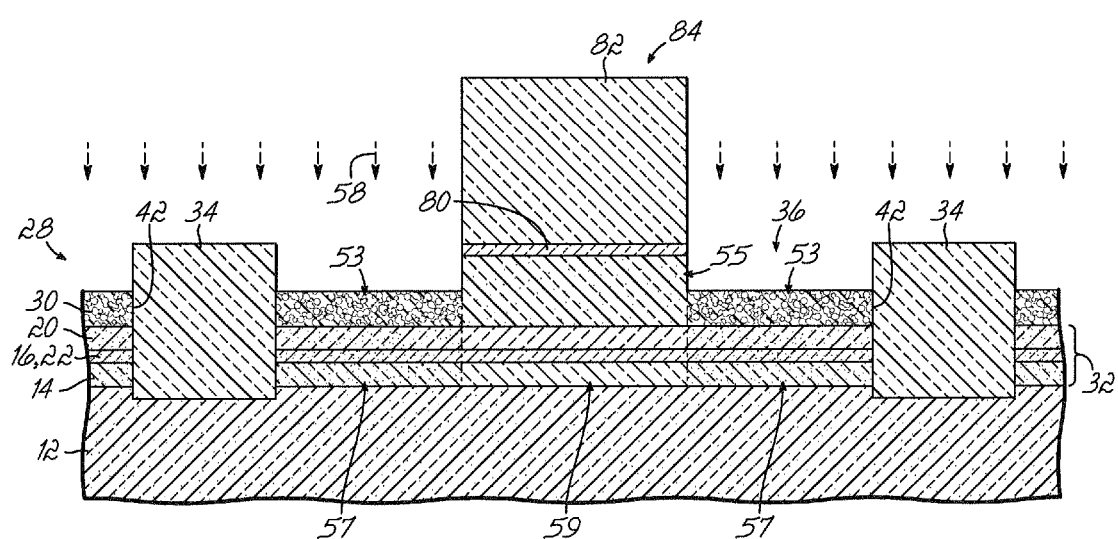

With reference to FIG. 14 in which like reference numerals refer to like features in FIG. 13 and at a subsequent fabrication stage, the semiconductor material in the unmasked regions 53 is converted to porous semiconductor material, as described with regard to FIG. 6. The masked region 55 of the body 36 is protected from the conversion process by the dummy gate 84 so that the constituent semiconductor material is unaffected by the conversion process.

Figure 15:
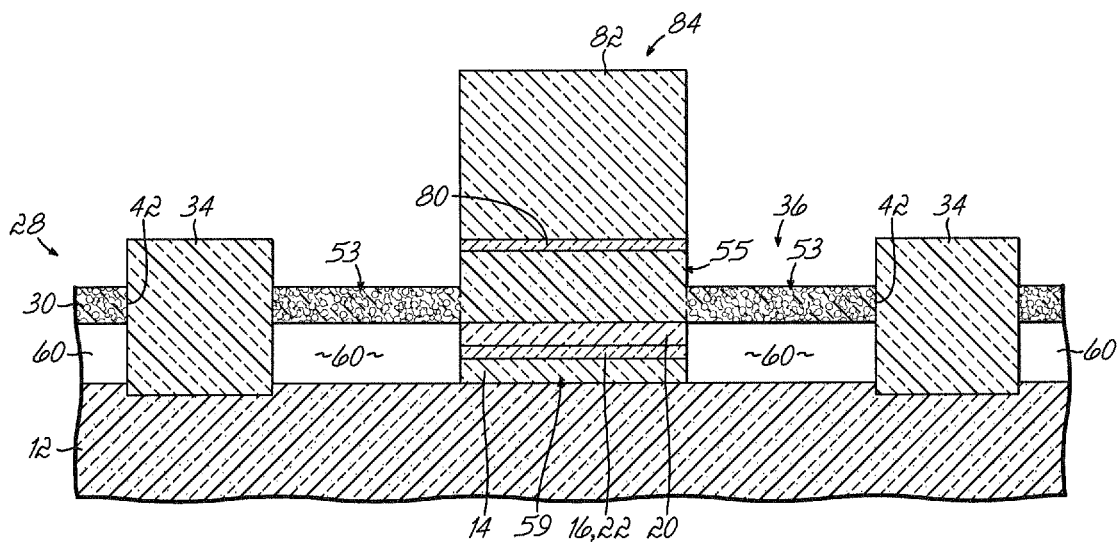

With reference to FIG. 15 in which like reference numerals refer to like features in FIG. 14 and at a subsequent fabrication stage, voids 60 are formed in the unmasked regions 57 of the buried insulator layer 32 formerly occupied by the damaged high-K dielectric material of layers 14, 20 and the corresponding regions of layers 16, 22, as described with regard to FIG. 7. The voids 60 flank and surround the remaining undamaged high-K dielectric material in the masked region 59 of the buried insulator layer 32, which underlies the masked region 55 of body 36.

Figure 16:
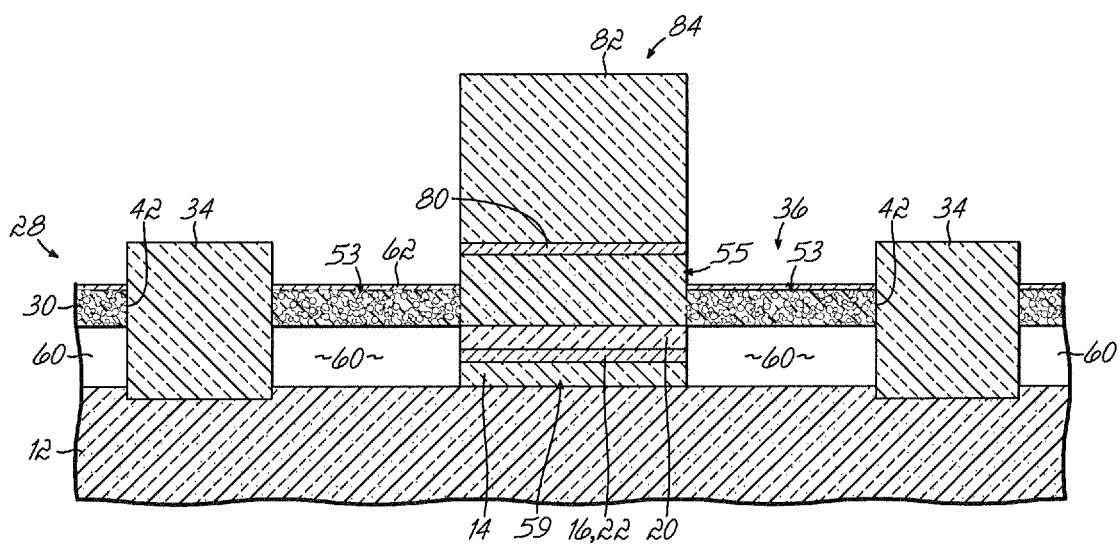

With reference to FIG. 16 in which like reference numerals refer to like features in FIG. 15 and at a subsequent fabrication stage, the semiconductor material in the unmasked regions 53 of body 36 is treated to form surface layer 62 that smooths the top surface 26 and seals pores that would otherwise open to the ambient environment of the substrate 28. This fabrication stage is described above with regard to FIG. 8.

Figure 17:
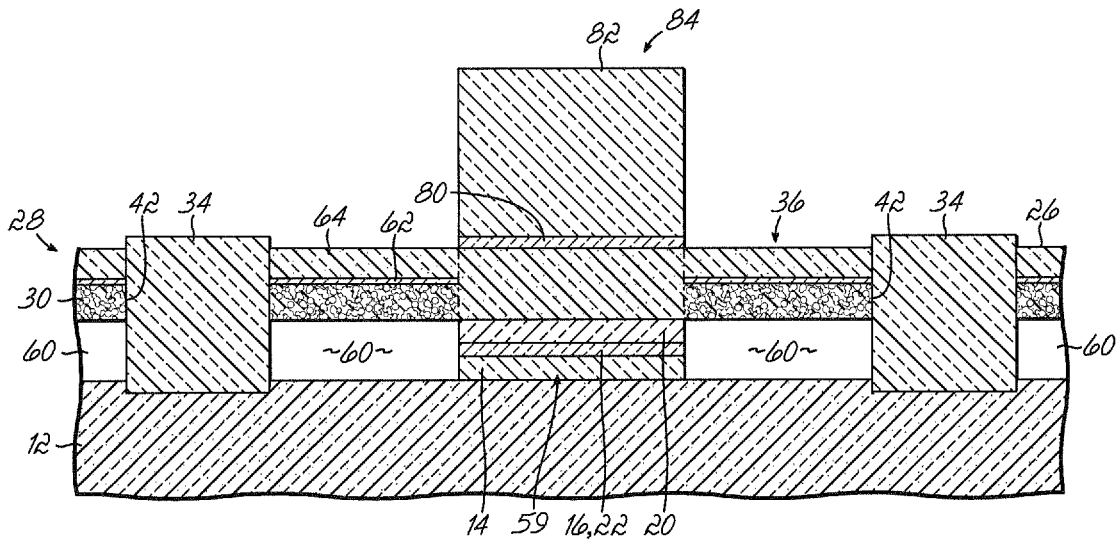

With reference to FIG. 17 in which like reference numerals refer to like features in FIG. 16 and at a subsequent fabrication stage, the epitaxial layer 64 is selectively formed on the unmasked regions 53 of the body 36 using the surface layer 62 as a seed for crystal growth, as described above with regard to FIG. 9. The epitaxial layer 64 may restore the initial thickness of the body 36 depicted in FIG. 11 or may provide a different thickness. Advantageously, the epitaxial layer 64 is formed to a thickness covering the dummy gate 84, polished to the horizontal level of the dummy gate 84, and then recessed with a suitable anisotropic etching process to the desired thickness.

Figure 18:
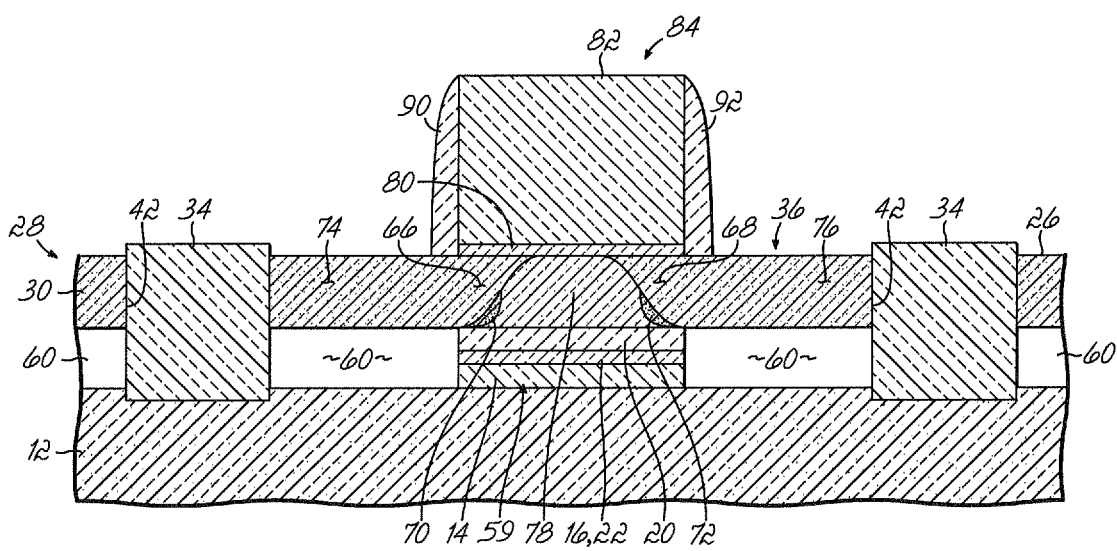

With reference to FIG. 18 in which like reference numerals refer to like features in FIG. 17 and at a subsequent fabrication stage, the porous semiconductor material of the SOT layer 30, the surface layer 62, and the epitaxial layer 64 are depicted in FIG. 18 as merged to establish the body 36 of semiconductor material in which portions of the semiconductor device 44 are fabricated. The extensions 66, 68 and halo regions 70, 72 are formed in the semiconductor material of the body 36 at opposing sides of the dummy gate 84, as described with regard to FIG. 10. Sidewall spacers 90, 92 of, for example, silicon oxide are formed on the vertical sidewalls of the dummy gate 84. The source/drain regions 74, 76 are formed in the constituent semiconductor material of the body 36, as described with regard to FIG. 10. The sidewall spacers 90, 92 align the ion implantation forming the source/drain regions 74, 76 relative to the dummy gate 84.

Figure 19:
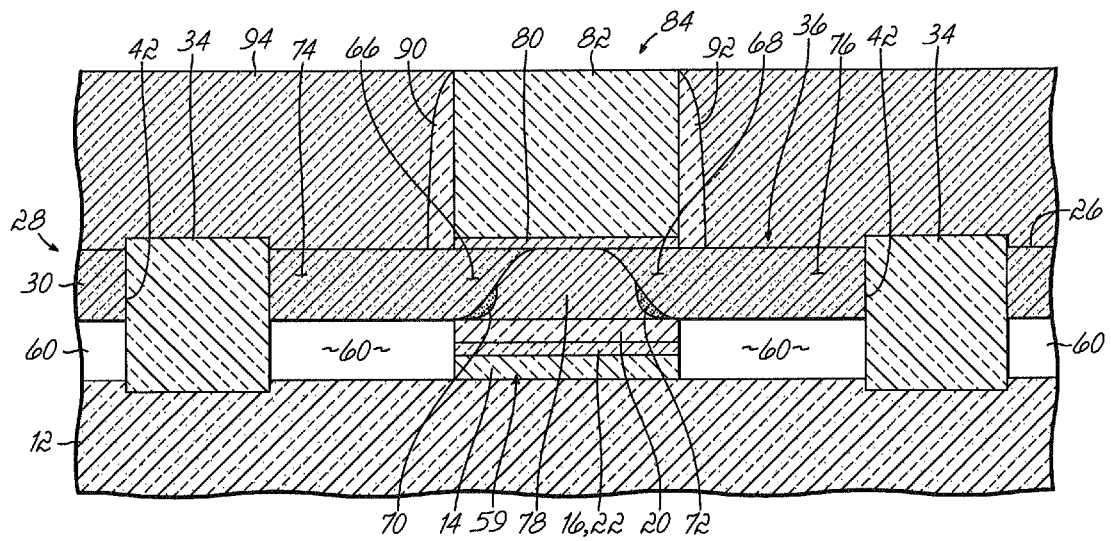

With reference to FIG. 19 in which like reference numerals refer to like features in FIG. 18 and at a subsequent fabrication stage, a layer 94 of a dielectric or insulating material, such as an oxide deposited by a CVD process, is formed across the substrate 28. The layer 94 is planarized by a conventional CMP process to a top surface of the dummy gate 84.

Figure 20:
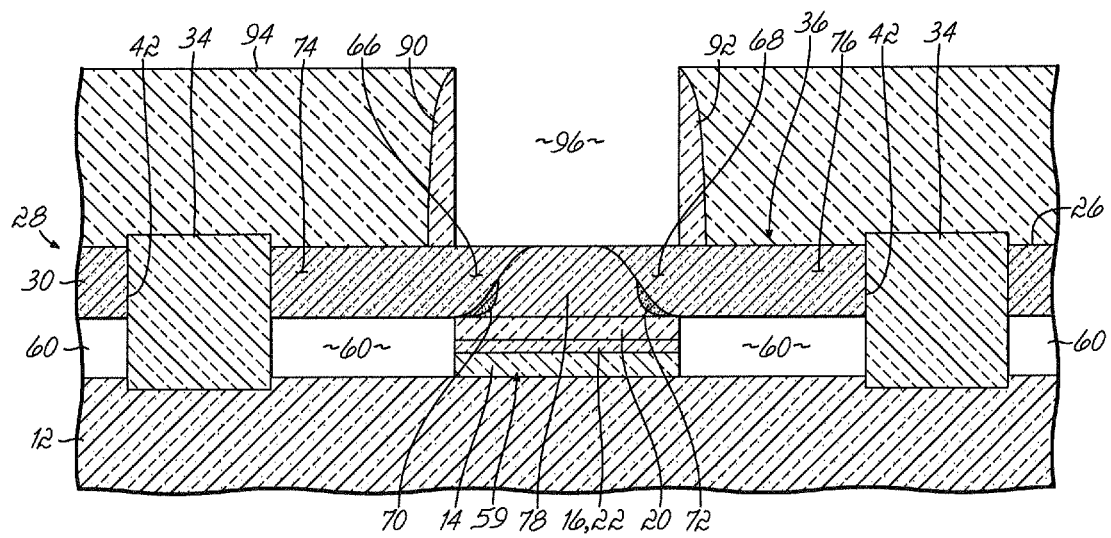

With reference to FIG. 20 in which like reference numerals refer to like features in FIG. 19 and at a subsequent fabrication stage, the dummy gate 84 is removed from the position between the sidewall spacers 90, 92. An etching process may be used to remove the dummy gate 84 that etches the materials constituting the dummy gate 84 selectively and/or directionally to the material constituting the dielectric layer 94. An open gate space 96 is defined in the volume vacated by the dummy gate 84.

Figure 21:
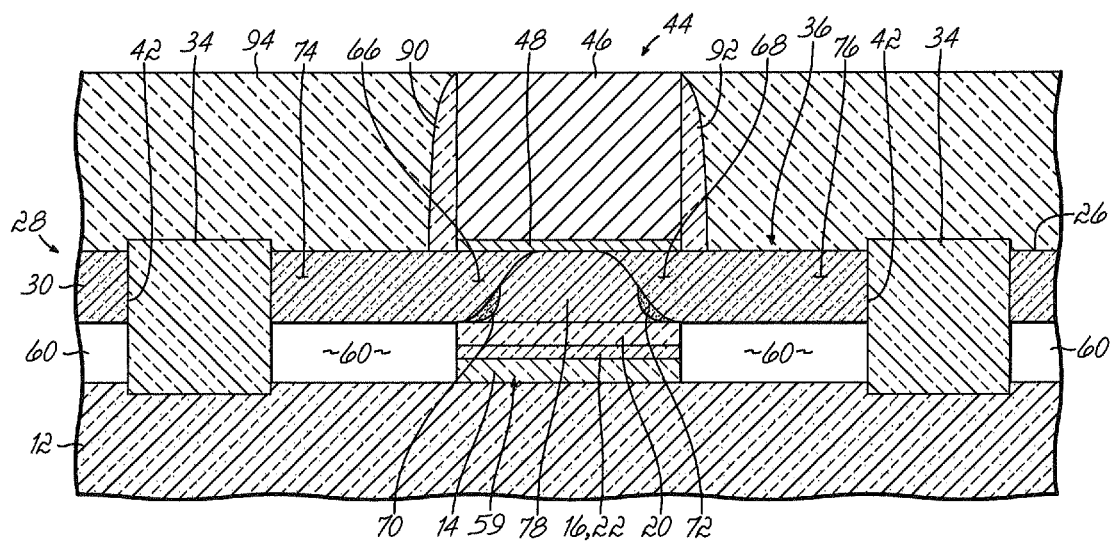

With reference to FIG. 21 in which like reference numerals refer to like features in FIG. 20 and at a subsequent fabrication stage, the semiconductor device 44 is completed by forming, with process steps described with regard to FIG. 3, the gate dielectric 48 and then the gate electrode 46 in the gate space 96. Additional conventional processing, which includes formation of contact vias and studs (not shown), multilayer patterned metallization (not shown), and interlevel dielectrics (not shown), completes the integrated circuit.

In alternative embodiments, the fabrication procedure of the present invention may be implemented using a silicon-on-insulator substrate with a conventional insulator layer composed of a standard-k insulator, such as silicon dioxide having a dielectric constant in the range of about 3.9 to about 4.2. Although not providing the full advantages of substrate 28 (FIG. 2), use of a silicon-on-insulator substrate with a conventional insulator layer formed from a standard-k dielectric material may be advantageous for certain device applications recognized by a person having ordinary skill in the art. Standard-k dielectric materials are considered to have a dielectric constant in the range of about 3.9 to about 9.

Figure 22:
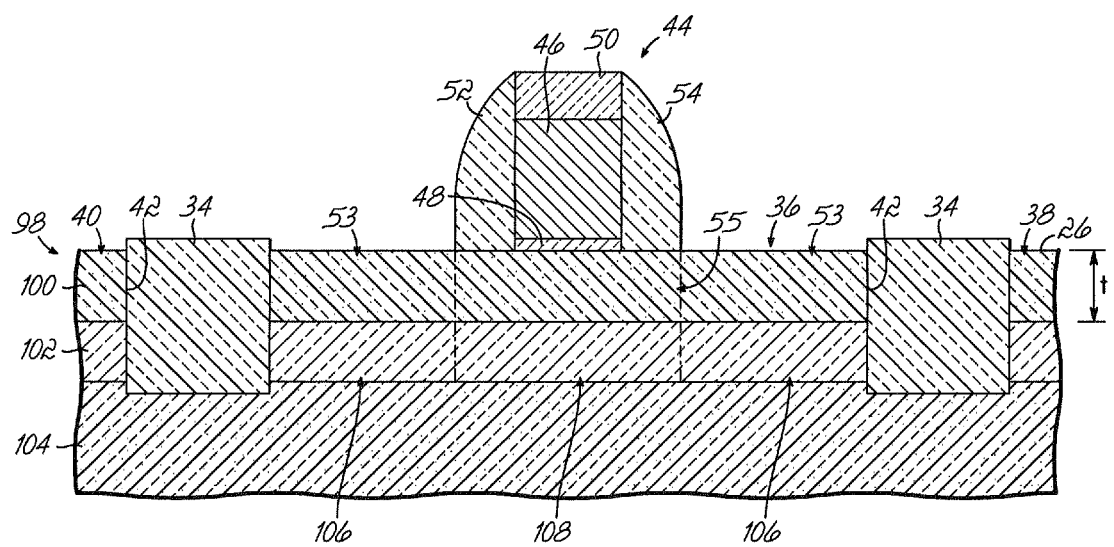
FIGS. 22 and 23 are diagrammatic cross-sectional views of a portion of a substrate at fabrication stages of a processing method in accordance with another embodiment of the present invention.
Figure 23:
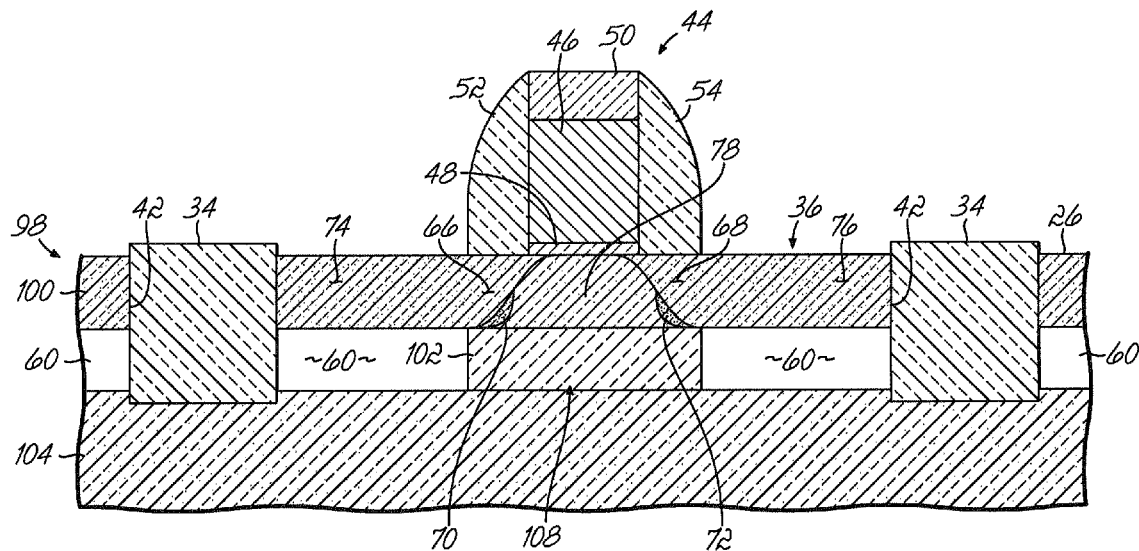

With reference to FIGS. 22 and 23 in which like reference numerals refer to like features in FIG. 3 and in accordance with an alternative embodiment of the present invention, a silicon-on-insulator (SOI) substrate 98 is provided that comprises a thin SOI layer 100, similar to SOI layer 30, of semiconductor material partitioned into a plurality of electrically-isolated bodies 36, 38, 40 by the shallow trench isolation regions 34, and a thin buried insulator layer 102 electrically isolating the SOI layer 100 from a handle wafer 104. The SOI layer 100 may be composed of silicon, which may be initially doped with an n-type dopant species to render the constituent silicon n-type or with a p-type dopant species to render the constituent silicon p-type. The handle wafer 104 may be formed from any suitable material including, but not limited to, silicon and polysilicon. The silicon-on-insulator substrate 98 may be fabricated by any suitable technique, such as a wafer bonding technique or a separation by implantation of oxygen (SIMOX) technique, familiar to a person having ordinary skill in the art. The SOI substrate 98 is initially processed, as described above with regard to FIG. 3, to form shallow trench isolation regions 34, gate electrode 46, gate cap 50, and sidewall spacers 52, 54. For simplicity in description, like reference numerals shown in FIGS. 23 and 24 will refer to like features in FIGS. 3-10.

Processing proceeds with subsequent process steps analogous to those as described above with regard to FIGS. 4-10, which culminates in a semiconductor device structure as shown in FIG. 23. A masked region 108 of the buried insulator layer 102, similar to masked region 59 of buried insulator layer 32, remains substantially intact after semiconductor device 44 is fabricated. The masked region 108 of the buried insulator layer 102 is disposed vertically between the channel region 78 of the SOI layer 100 and the handle wafer 104. The processing defines voids 60 in unmasked regions 106 (FIG. 22) of the buried insulator layer 102 not masked by the gate electrode 46, gate cap 50, and sidewall spacers 52, 54, as described above with regard to FIGS. 4-10. The voids 60 flank, or are otherwise juxtaposed with, the masked region 108 of the buried insulator layer 102. As described above, the voids 60 are effective for reducing the effective dielectric constant of the unmasked regions 106 in comparison to the masked region 108 and, in certain embodiments, the masked region 108 may have a dielectric constant less than about 3.9 or a dielectric constant as low as about unity (1.0).

Figure 24:
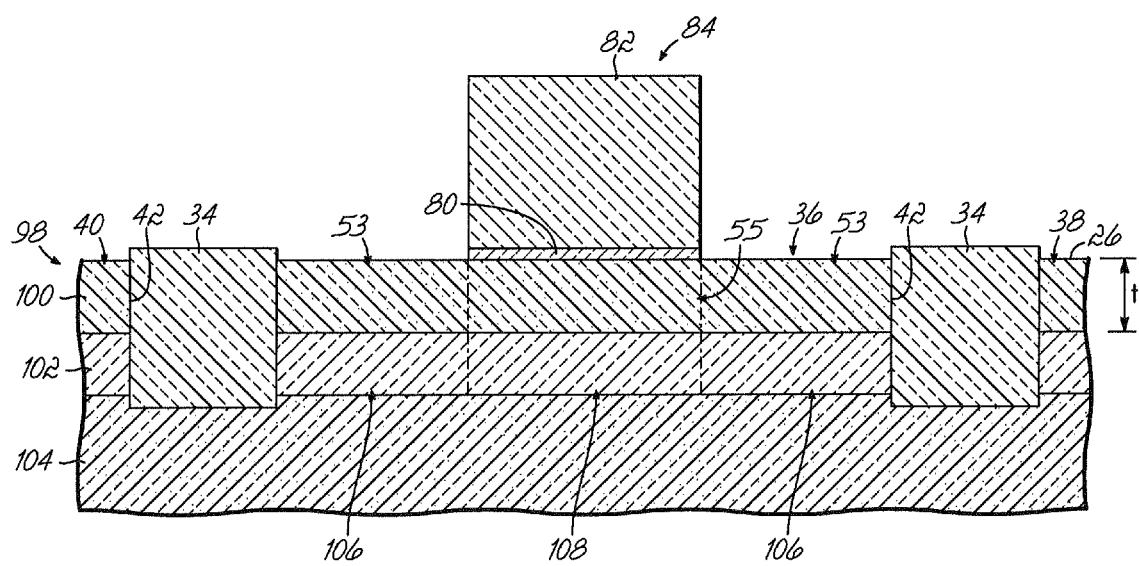
FIGS. 24 and 25 are diagrammatic cross-sectional views of a portion of a substrate at fabrication stages of a processing method in accordance with another embodiment of the present invention.
Figure 25:
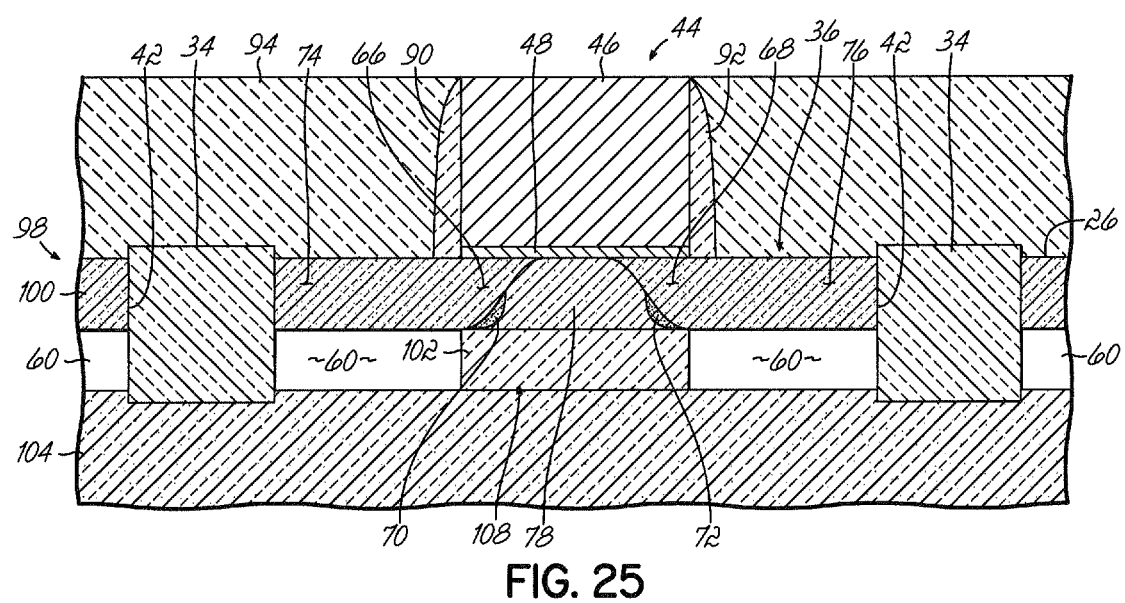

With reference to FIGS. 24 and 25 in which like reference numerals refer to like features in FIG. 11 and in accordance with an alternative embodiment of the present invention, the replacement gate process may be employed that relies on the dummy gate 84 (FIG. 24) to define the voids 60 in the unmasked regions 106 of the buried insulator layer 102 and the substantially intact masked region 108 of the buried insulator layer 102. Processing proceeds with process steps analogous to those as described above with regard to FIGS. 12-21, which culminates in a construction as shown in FIG. 25. As described above, the effective dielectric constant of the unmasked regions 106 is reduced in comparison to the masked region 108 because of the presence of the voids 60. In certain embodiments, the masked region 108 may have a dielectric constant less than about 3.9 or a dielectric constant as low as about unity (1.0).

References herein to terms such as "vertical", "horizontal", etc. are made by way of example, and not by way of limitation, to establish a frame of reference. The term "horizontal" as used herein is defined as a plane parallel to the top surface 26, regardless of its actual three-dimensional spatial orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of fabricating a semiconductor device structure using a substrate carrying a dielectric layer and a semiconductor layer on the dielectric layer, the method comprising:
    implanting ions through the semiconductor layer into a first region of the dielectric layer;
    converting a region of the semiconductor layer from a non-porous semiconductor material to a porous semiconductor material; and
    at least partially removing the ion implanted first region of the dielectric layer through the porous semiconductor material in the region of the semiconductor layer to define at least one void.

2. The method of claim 1 further comprising:
    directing an etchant through the porous semiconductor material that is effective to at least partially remove the ion implanted first region of the dielectric layer for defining the at least one void.

3. The method of claim 1 further comprising:
    masking a channel region of the semiconductor layer when the ions are implanted and the ion implanted first region of the dielectric layer is at least partially removed.

4. The method of claim 3 wherein masking the channel region of the semiconductor layer further comprises:
    forming a dummy gate of a sacrificial material over the channel region of the semiconductor layer that operates as an implantation mask when the ions are implanted and as an etch mask when the ion implanted first region of the dielectric layer is at least partially removed.

5. The method of claim 4 further comprising:
    removing the sacrificial material of the dummy gate after the ion implanted first region of the dielectric layer is at least partially removed; and
    forming a gate electrode of a field effect transistor over the channel region of the semiconductor layer.

6. The method of claim 3 wherein masking the channel region of the semiconductor layer further comprises:
    forming a gate electrode of a field effect transistor over the channel region of the semiconductor layer; and
    covering the gate electrode with sidewall spacers and a cap that cooperate to protect the gate electrode when the ions are implanted and when the ion implanted first region of the dielectric layer is at least partially removed.

7. The method of claim 3 wherein the masked channel region masks a second region of the dielectric layer juxtaposed with the ion implanted first region when the ions are implanted, and at least partially removing the ion implanted first region further comprises:
    removing at least the portion of the ion implanted first region of the dielectric layer selectively to the second region of the dielectric layer so that the second region of the dielectric layer borders the at least one void.

8. The method of claim 7 wherein the masked second region of the dielectric layer has a dielectric constant greater than about 10 and the ion implanted first region of the dielectric layer has a dielectric constant less than about 3.9.

9. The method of claim 7 wherein the masked second region of the dielectric layer has a dielectric constant greater than about 10 and the ion implanted first region of the dielectric layer has a dielectric constant of approximately 1.0 after the void is formed.

10. The method of claim 3 further comprising:
    doping the semiconductor layer overlying the ion implanted first region to form a source/drain region of a field effect transistor adjacent to the channel region.

11. A method of fabricating a semiconductor device structure using a substrate carrying a dielectric layer and a semiconductor layer on the dielectric layer, the method comprising:
    implanting ions through the semiconductor layer into a first region of the dielectric layer;
    at least partially removing the ion implanted first region of the dielectric layer to define at least one gas-filled void; and
    doping the semiconductor layer overlying the ion implanted first region to form a source/drain region of a field effect transistor.

12. The method of claim 11 further comprising:
    converting the semiconductor material of the semiconductor layer into a porous semiconductor material; and
    directing an etchant through the porous semiconductor material that is effective to at least partially remove the ion implanted first region of the dielectric layer for defining the at least one gas-filled void.

13. The method of claim 11 further comprising:
    masking a channel region of the semiconductor layer when the ions are implanted and the ion implanted first region of the dielectric layer is at least partially removed.

14. The method of claim 13 wherein masking the channel region of the semiconductor layer further comprises:
   forming a dummy gate of a sacrificial material over the channel region of the semiconductor layer that operates as an implantation mask when the ions are implanted and as an etch mask when the ion implanted first region of the dielectric layer is at least partially removed.

15. The method of claim 14 further comprising:
   removing the sacrificial material of the dummy gate after the ion implanted first region of the dielectric layer is at least partially removed; and
   forming a gate electrode of a field effect transistor over the channel region of the semiconductor layer.

16. The method of claim 13 wherein masking the channel region of the semiconductor layer further comprises:
   forming a gate electrode of a field effect transistor over the channel region of the semiconductor layer; and
   covering the gate electrode with sidewall spacers and a cap that cooperate to protect the gate electrode when the ions are implanted and when the ion implanted first region of the dielectric layer is at least partially removed.

17. The method of claim 13 wherein the masked channel region masks a second region of the dielectric layer juxtaposed with the ion implanted first region when the ions are implanted, and at least partially removing the ion implanted first region further comprises:
   removing at least the portion of the ion implanted first region of the dielectric layer selectively to the second region of the dielectric layer so that the second region of the dielectric layer borders the at least one gas-filled void.

18. The method of claim 17 wherein the masked second region of the dielectric layer has a dielectric constant greater than about 10 and the ion implanted first region of the dielectric layer has a dielectric constant less than about 3.9.

19. The method of claim 17 wherein the masked second region of the dielectric layer has a dielectric constant greater than about 10 and the ion implanted first region of the dielectric layer has a dielectric constant of approximately 1.0 after the gas-filled void is formed.

20. The method of claim 13 wherein the source/drain region is adjacent to the channel region.

* * * * *

UNITED STATES PATENT AND TRADEMARK OFFICE
CERTIFICATE OF CORRECTION

PATENT NO. : 7,659,178 B2  Page 1 of 1
APPLICATION NO. : 11/379655
DATED : February 9, 2010
INVENTOR(S) : Cheng et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 675 days.

Signed and Sealed this

Twenty-eighth Day of December, 2010

David J. Kappos
*Director of the United States Patent and Trademark Office*